United States Patent
Hock et al.

(10) Patent No.: US 12,435,415 B2
(45) Date of Patent: Oct. 7, 2025

(54) THERMAL ATOMIC LAYER DEPOSITION OF TERNARY GALLIUM OXIDE THIN FILMS

(71) Applicant: Illinois Institute of Technology, Chicago, IL (US)

(72) Inventors: Adam Hock, Chicago, IL (US); Michael James Foody, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 534 days.

(21) Appl. No.: 17/538,760

(22) Filed: Nov. 30, 2021

(65) Prior Publication Data

US 2023/0167548 A1    Jun. 1, 2023

(51) Int. Cl.
  *C23C 16/455*   (2006.01)
  *C23C 16/40*    (2006.01)
  *H01L 21/02*    (2006.01)

(52) U.S. Cl.
  CPC ........ *C23C 16/45527* (2013.01); *C23C 16/40* (2013.01); *H01L 21/02194* (2013.01); *H01L 21/02205* (2013.01); *H01L 21/0228* (2013.01)

(58) Field of Classification Search
  CPC .............. C23C 16/45527; C23C 16/40; C23C 16/45531; C23C 16/45553;
  (Continued)

(56) References Cited

U.S. PATENT DOCUMENTS 6,949,269 B2 * 9/2005 Seidl ................... C23C 16/0281
                                                                427/256
7,557,229 B2 * 7/2009 Gordon ................ C23C 16/404
                                                                556/136
(Continued)

FOREIGN PATENT DOCUMENTS

CN         110438472 A  * 11/2019  ............. C23C 16/40
WO    WO-2019218581 A1 * 11/2019  ............. C23C 16/40

OTHER PUBLICATIONS

InGaZnO formation (Year: 2019).*
(Continued)

*Primary Examiner* — Dale E Page
*Assistant Examiner* — Quovaunda Jefferson
(74) *Attorney, Agent, or Firm* — Withrow & Terranova, PLLC

(57) ABSTRACT

The present disclosure describes a method of a thermal atomic layer deposition (ALD) process of depositing a ternary gallium oxide thin film, which includes gallium, a metal element other than gallium, and oxygen. The disclosed method starts with providing a reactive surface. Next, one or more ALD growth cycles are conducted. Each ALD growth cycle includes one or more first ALD sub-cycles and one or more second ALD sub-cycles. Herein, conducting each first ALD sub-cycles includes applying a pulse of a first metal precursor and a pulse of water sequentially, where the first metal precursor is a gallium compound. Conducting each second ALD sub-cycles includes applying a pulse of a second metal precursor and a pulse of water sequentially, where the second metal precursor includes the metal element other than gallium.

22 Claims, 8 Drawing Sheets

Figure 1:
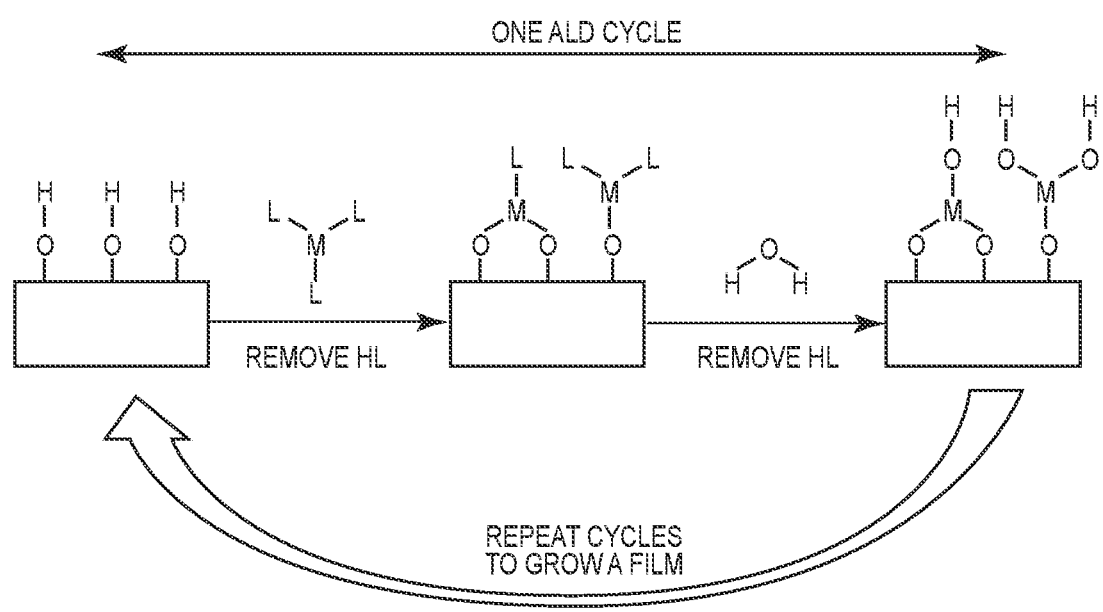

(58) Field of Classification Search
CPC ......... H01L 21/02194; H01L 21/02205; H01L 21/0228; H01L 21/02381; H01L 21/02565; H01L 21/0262; H01L 21/02175
See application file for complete search history.

(56) References Cited

U.S. PATENT DOCUMENTS

| | | | |
|---|---|---|---|
| 8,796,483 B2 | 8/2014 | Gordon et al. | |
| 9,382,618 B2 | 7/2016 | Martinson et al. | |
| 9,917,156 B1* | 3/2018 | Laboutin | H01L 29/2003 |
| 10,640,435 B2 | 5/2020 | Stair et al. | |
| 2017/0022612 A1* | 1/2017 | Lei | C23C 16/342 |
| 2021/0118672 A1* | 4/2021 | Madia | H01L 21/02581 |

OTHER PUBLICATIONS

Fan et al (Year: 2019).*

Comstock, D. et al., "Atomic Layer Deposition of Ga2O3 Films Using Trimethylgallium and Ozone," Chemistry of Materials, vol. 24, Oct. 18, 2012, American Chemical Society, 8 pages.

Dezelah, J. et al., "Atomic Layer Deposition of Ga2O3 Films from a Dialkylamido-Based Precursor," Chemistry of Materials, vol. 18, No. 2, Dec. 22, 2005, American Chemical Society, pp. 471-475.

George, S., "Atomic Layer Deposition: An Overview," Chemical Reviews, vol. 110, No. 1, Nov. 30, 2009, American Chemical Society, 21 pages.

Larsson, F. et al., "Atomic layer deposition of amorphous tin-gallium oxide films," Journal of Vacuum Science & Technology A, vol. 37, Apr. 19, 2019, American Vacuum Society, 10 pages.

Larsson, F. et al., "Atomic Layer Deposition of Ternary Compounds on Cu(In,Ga)Se2: An In Situ Quartz Crystal Microbalance Study," ACS Applied Energy Materials, vol. 3, Issue 7, Jun. 25, 2020, American Chemical Society, 21 pages.

Lee, H. et al., "ALD and MOCVD of Ga2O3 Thin Films Using the New Ga Precursor Dimethylgallium Isopropoxide, Me2GaOiPr," Chemical Vapor Deposition, vol. 17, Issue 7-9, Sep. 9, 2011, pp. 191-197.

Roberts, J.W. et al., "α-Ga2O3 grown by low temperature atomic layer deposition on sapphire," Journal of Crystal Growth, vol. 487, Feb. 8, 2018, 10 pages.

Shan, F.K. et al., "Structural, electrical, and optical properties of transparent gallium oxide thin films grown by plasma-enhanced atomic layer deposition," Journal of Applied Physics, vol. 98, Jul. 20, 2005, American Institute of Physics, 7 pages.

Sheng, J. et al., "Review Article: Atomic layer deposition for oxide semiconductor thin film transistors: Advances in research and development," Journal of Vacuum Science & Technology A, vol. 36, Nov. 2, 2018, American Vacuum Society, 14 pages.

* cited by examiner

THERMAL ATOMIC LAYER DEPOSITION OF TERNARY GALLIUM OXIDE THIN FILMS

GOVERNMENT SUPPORT

This invention was made with government funds under Agreement No. HR0011-18-3-0004 awarded by The Defense Advanced Research Projects Agency (DARPA). The U.S. Government has certain rights in this invention.

FIELD OF THE DISCLOSURE

The technology of the disclosure relates to growth of ternary gallium oxide thin films, which include gallium, another metal element, and oxygen, by thermal atomic layer deposition (ALD) under conditions compatible with back-end-of-line (BEOL) processing.

BACKGROUND

With the rapid development of semiconductor technologies, metal oxide materials are widely used in forming dielectric layers in semiconductor devices. Compared to binary metal oxide materials (formed from one metal component with oxygen), ternary metal oxide materials (formed from two metal components with oxygen) have been relatively underdeveloped, thus the ternary metal oxide materials may have more potential for high impact materials. In addition, the ternary metal oxide materials may provide further flexibility in band gap, carrier mobility, and/or thermal conductivity. Some of these ternary metal oxide materials, such as ternary gallium oxides, which include gallium, another metal element, and oxygen, have been shown to have desirable potential in next generation thin film applications including integrated circuit design to photovoltaic devices.

Contemporary thin film fabrication uses a variety of techniques such as sol-gel method, spray pyrolysis, spin coating, electron-beam plasma-deposition, sputtering, and chemical vapor deposition (CVD) including plasma-enhanced CVD (PECVD) and atomic layer deposition (ALD). Among them, due to the layer-by-layer growth, ALD is one of the most promising techniques for growing thin films with atomic level precision.

The development of ternary oxide ALD has been outpaced by the development of binary ALD processes. This is because it is difficult to design precursors that deposit high purity films with tightly controlled reaction chemistry. In particular, it is difficult to control the elemental ratio of a resulting ternary film.

Accordingly, there is an object of the present disclosure to provide an improved ALD process for depositing ternary metal oxide thin films, especially ternary gallium oxide thin films, without sacrificing impurity requirements. In addition, the improved ALD process is capable of controlling the concentration ratio of gallium versus the other metal in the resulting thin films.

SUMMARY

The present disclosure describes an exemplary method of a thermal atomic layer deposition (ALD) process of depositing a ternary gallium oxide thin film, which includes gallium, another metal element, and oxygen. The disclosed method starts with providing a reactive surface. Then one or more ALD growth cycles, each of which includes one or more first ALD sub-cycles and one or more second ALD sub-cycles, are conducted. Herein, conducting each of the one or more first ALD sub-cycles includes applying a pulse of a first metal precursor and applying a pulse of an oxygen source after applying the pulse of the first metal precursor. The first metal precursor is a gallium compound with one or more of an alkyl ligand, an amido ligand, an amidinato ligand, an alkenyl ligand, and a guanidinato ligand. Conducting each of the one or more second ALD sub-cycles includes applying a pulse of a second metal precursor and applying a pulse of an oxygen source after applying the pulse of the second metal precursor. The second metal precursor includes the metal element other than gallium.

In one embodiment of the exemplary method, the oxygen source in each of the one or more first ALD sub-cycles is water, and the oxygen source in each of the one or more second ALD sub-cycles is water.

According to one embodiment, the exemplary method further includes repeating the ALD growth cycle.

In one embodiment of the exemplary method, conducting each of the one or more ALD growth cycles comprises conducting one first ALD sub-cycle and conducting one second ALD sub-cycle in series.

In one embodiment of the exemplary method, the first ALD sub-cycle is conducted before the second ALD sub-cycle within one ALD growth cycle.

In one embodiment of the exemplary method, the first ALD sub-cycle is conducted after the second ALD sub-cycle within one ALD growth cycle.

In one embodiment of the exemplary method, conducting each of the one or more ALD growth cycles comprises conducting one first ALD sub-cycle and conducting two sequential second ALD sub-cycles.

In one embodiment of the exemplary method, the first ALD sub-cycle is followed by the two sequential second ALD sub-cycles within one ALD growth cycle.

In one embodiment of the exemplary method, conducting each of the one or more first ALD sub-cycles further includes one purge step between applying the pulse of the first metal precursor and applying the pulse of water, and another purge step after applying the pulse of water.

In one embodiment of the exemplary method, conducting each of the one or more second ALD sub-cycles further comprises one purge step between applying the pulse of the second metal precursor and applying the pulse of water, and another purge step after applying the pulse of water.

In one embodiment of the exemplary method, the first metal precursor has a formula of $GaL1(L2)_2$. Herein, Ga is a central gallium atom, and L1 and L2 are ligands surrounding the central gallium atom. Each of L1 and L2 is an alkyl ligand, an amido ligand, an amidinato ligand, an alkenyl ligand, or a guanidinato ligand.

In one embodiment of the exemplary method, L1 and L2 are a same ligand.

In one embodiment of the exemplary method, L1 and L2 are different ligands.

In one embodiment of the exemplary method, each of L1 and L2 is selected from one of a N,N'-diisopropylacetamidinato-group (-amd), a N,N'-diisopropylformamidinato-group (-famd), a methyl group (-Me), a N-butyl group (-nBu), a vinyl group (-vinyl), a dimethylamido-group ($-NMe_2$), and a N,N'-diisopropyl-N-dimethyl-guanidinato-group (-guan).

In one embodiment of the exemplary method, the first metal precursor is one of a group consisting of $Ga(amd)_3$, $[Ga(famd)_3]_2$, $Ga(amd)_2(Me)$, $Ga(amd)(Me)_2$, $Ga(amd)(nBu)_2$, $Ga(amd)(vinyl)_2$, $Ga(amd)(NMe_2)_2$, $Ga(guan)(NMe_2)_2$, and $[Ga(NMe_2)_3]_2$.

In one embodiment of the exemplary method, the second metal precursor is an organic aluminum precursor.

In one embodiment of the exemplary method, the first metal precursor is Ga(amd)$_3$, the second metal precursor is Trimethylaluminium (TMA), and the ternary metal oxide thin film is formed of gallium aluminum oxide (Ga$_x$Al$_{1-x}$)$_2$O$_3$, wherein 0<x<1.

In one embodiment of the exemplary method, a concentration ratio of gallium versus the metal element in the resulting ternary gallium oxide thin film from the thermal ALD process is dependent on a pulse ratio between pulses of the first metal precursor and pulses of the second metal precursor within one ALD growth cycle.

In one embodiment of the exemplary method, the concentration ratio of gallium versus the metal element in the resulting ternary gallium oxide thin film is further dependent on sub-cycle order in one ALD growth cycle, pulsing time of each pulse of the first metal precursor, and pulsing time of each pulse of the second metal precursor.

In one embodiment of the exemplary method, in one ALD growth cycle, a number of the pulses of the first metal precursor is N, and a number of the pulses of the second metal precursor is M, wherein N and M are positive integers.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows an exemplary atomic layer deposition (ALD) cycle in a ALD process for growing a binary metal oxide film.

Figure 2A:
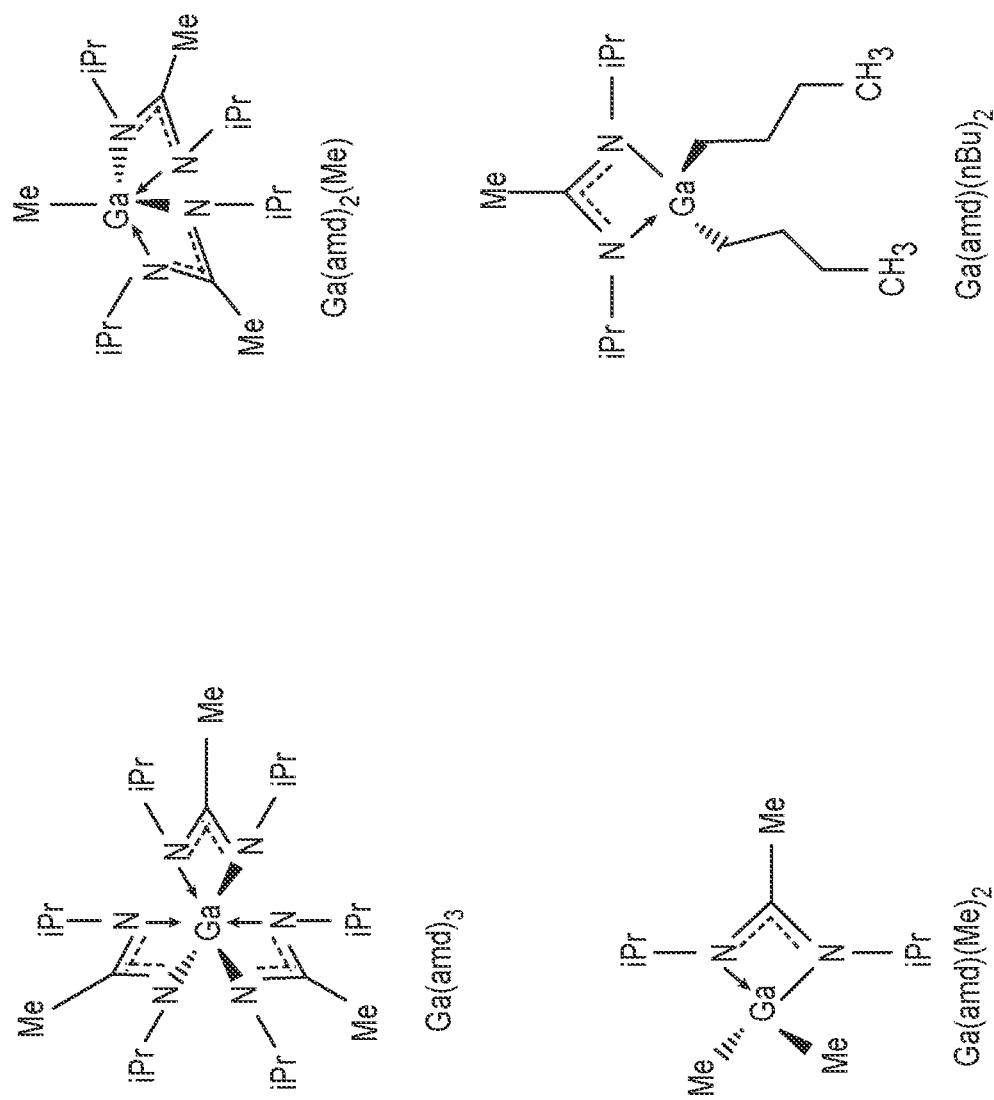
Figure 2B:
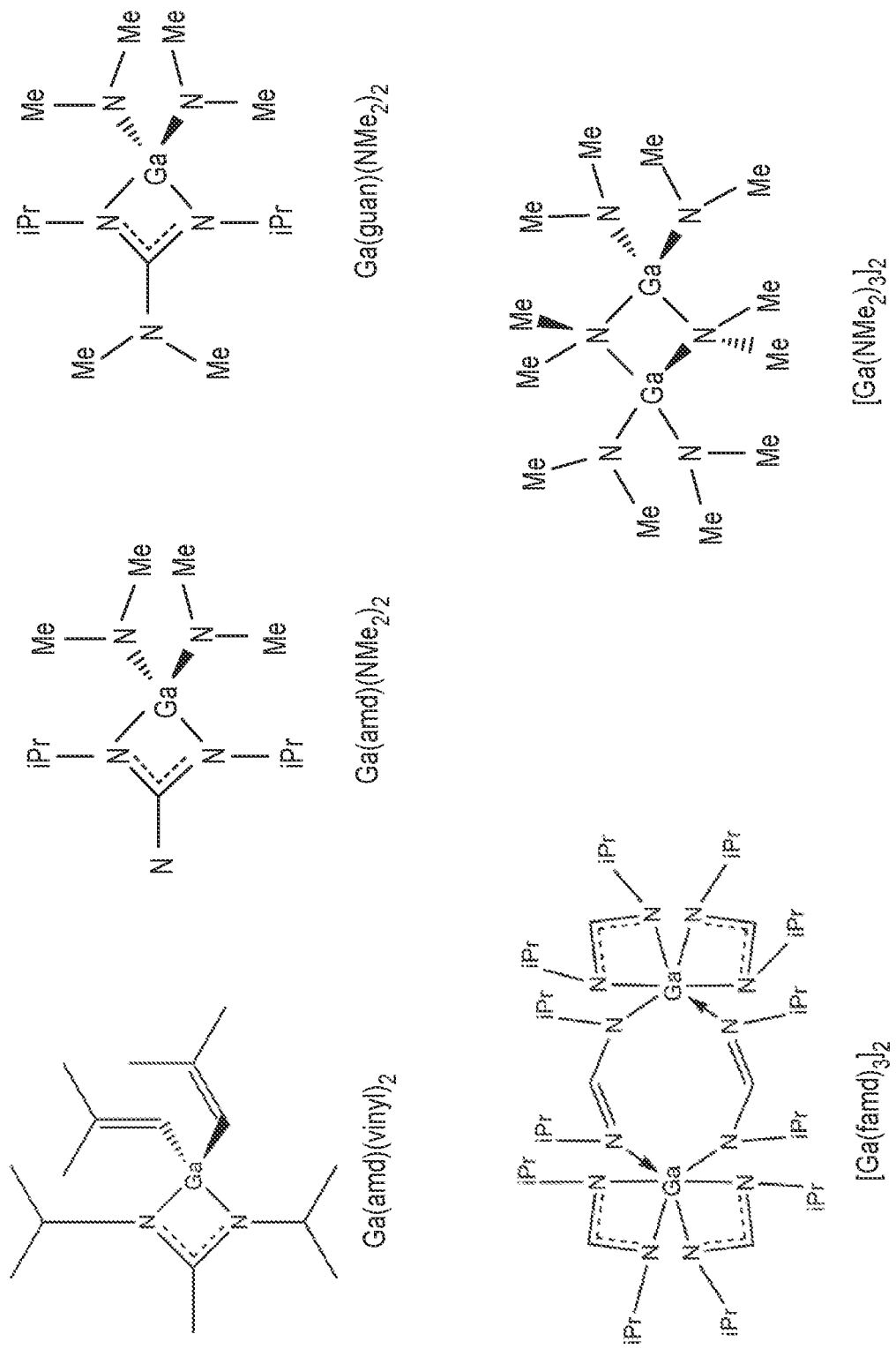

FIGS. 2A and 2B provide exemplary gallium precursors used to form a ternary gallium oxide thin film in a thermal ALD process according to one embodiment of the present disclosure.

Figure 3:
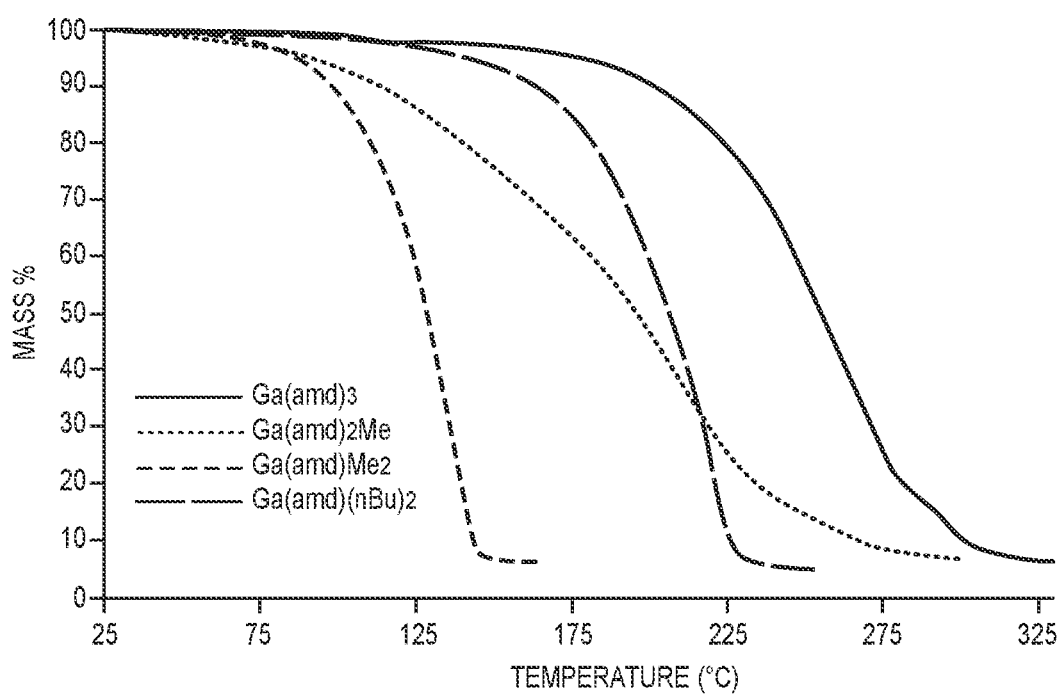

FIG. 3 provides an evaporation chart of some exemplary gallium precursors shown in FIG. 2A.

Figure 4A:
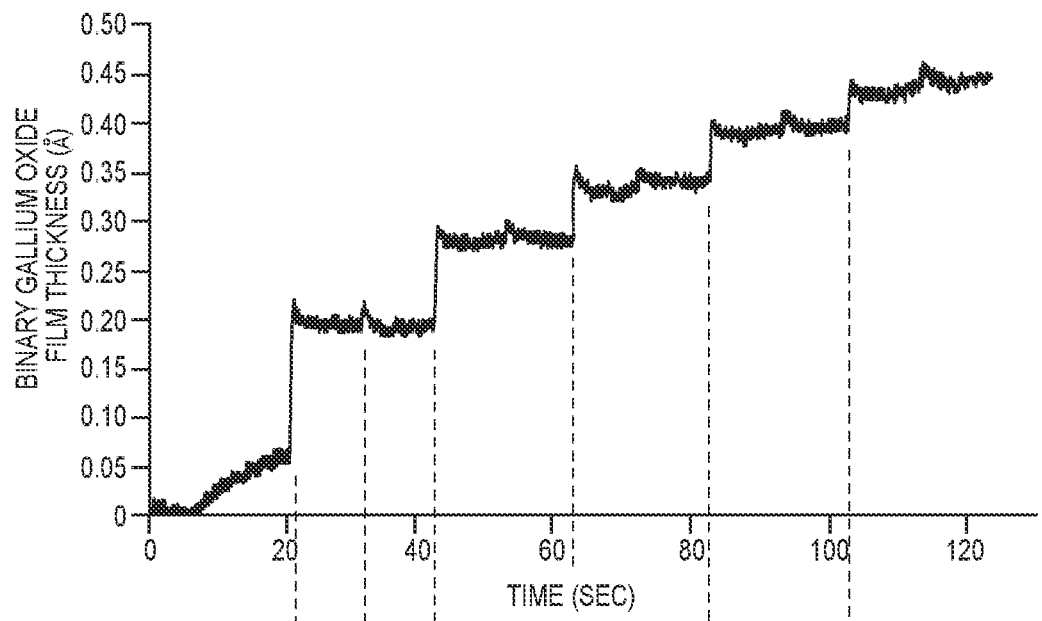
Figure 4B:
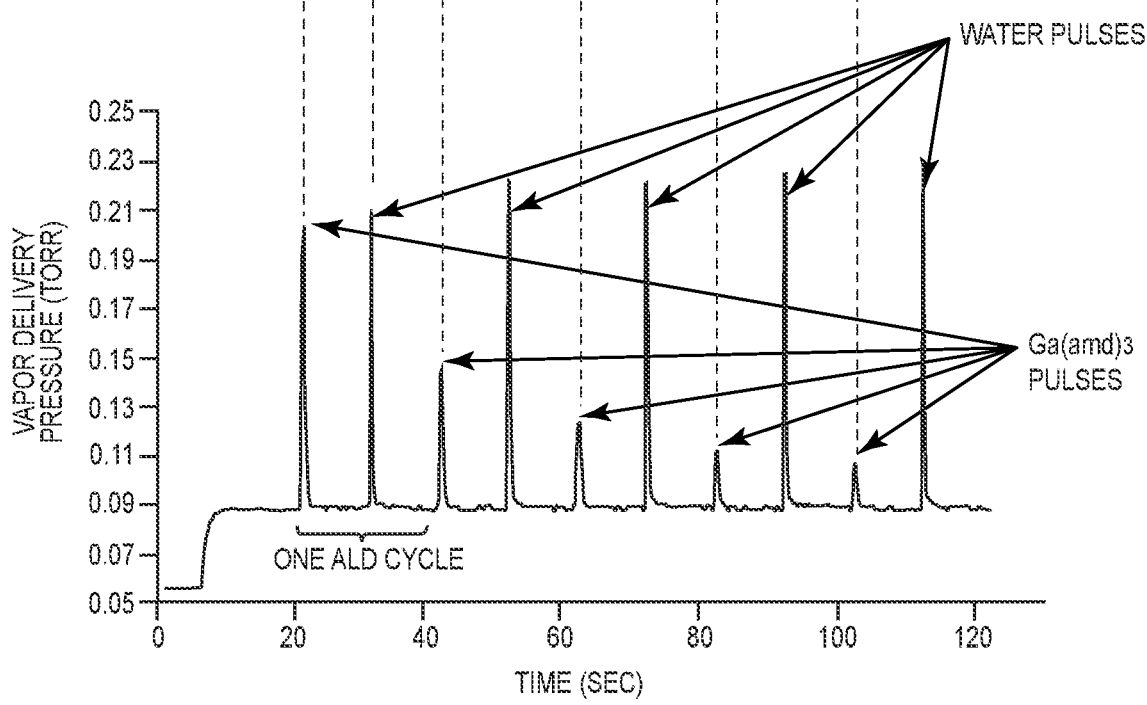

FIGS. 4A and 4B provide experimental results of binary gallium oxide film growth in a thermal ALD process by using Ga(amd)$_3$ as a gallium precursor.

Figure 5:
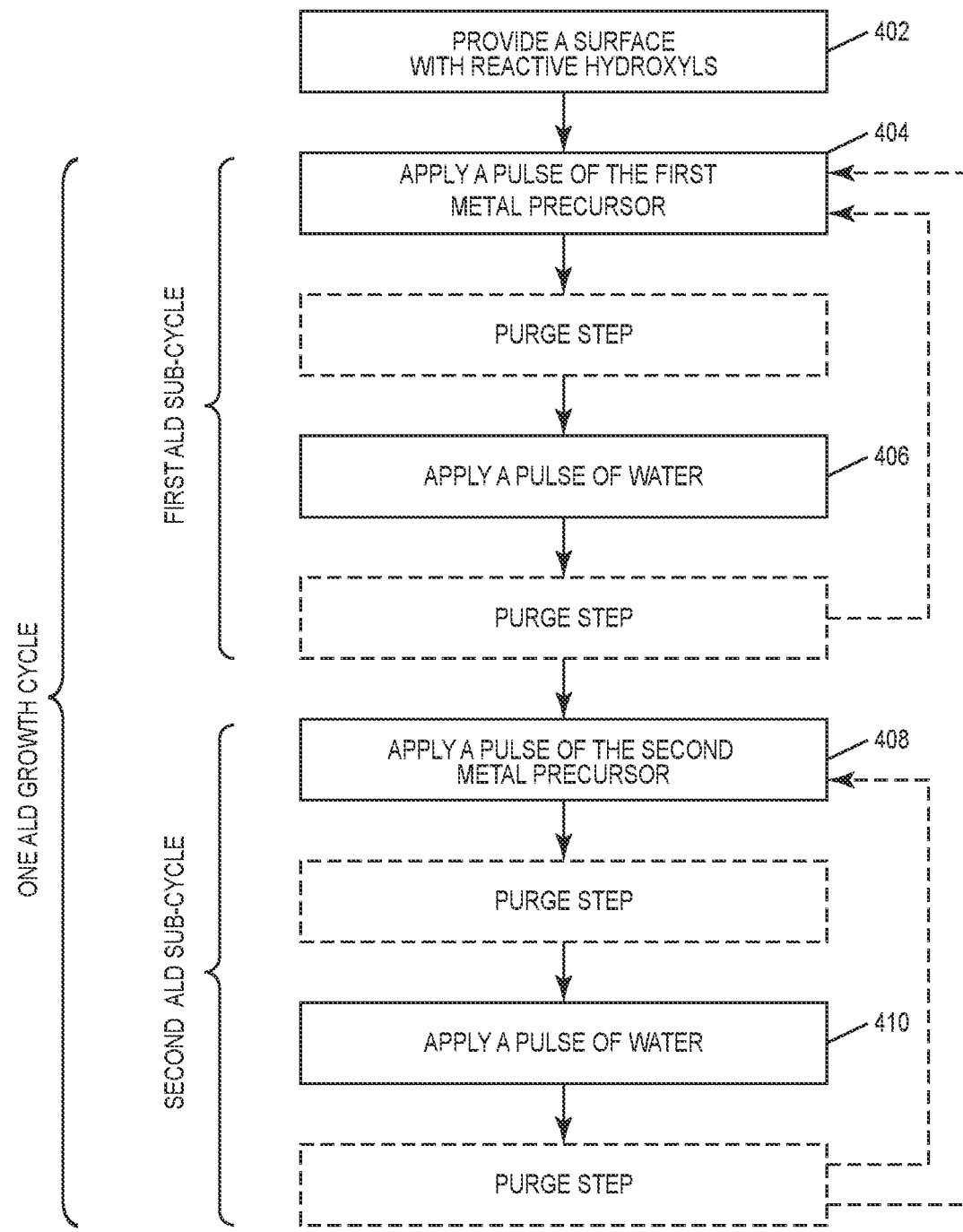

FIG. 5 provides an exemplary flow chart of a thermal ALD process for growth of a ternary gallium oxide film according to one embodiment of the present disclosure.

Figure 6:
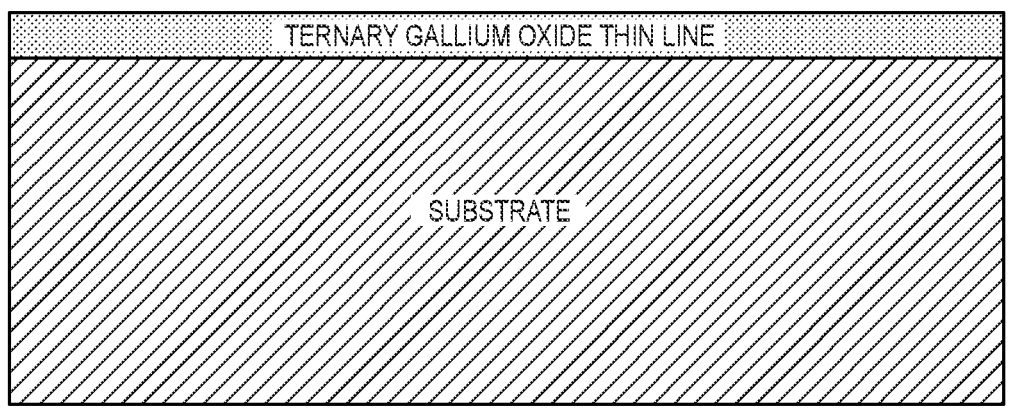

FIG. 6 provides an exemplary ternary gallium oxide thin film formed over a substrate by the thermal ALD process illustrated in FIG. 5.

Figure 7A:
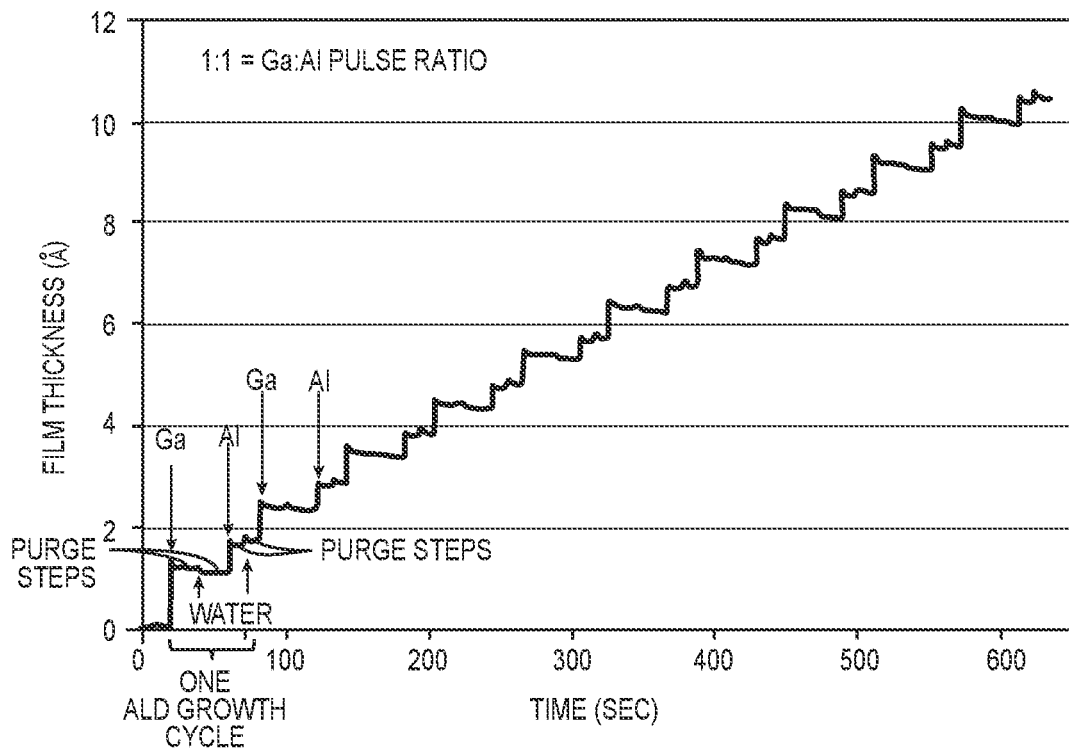
Figure 7B:
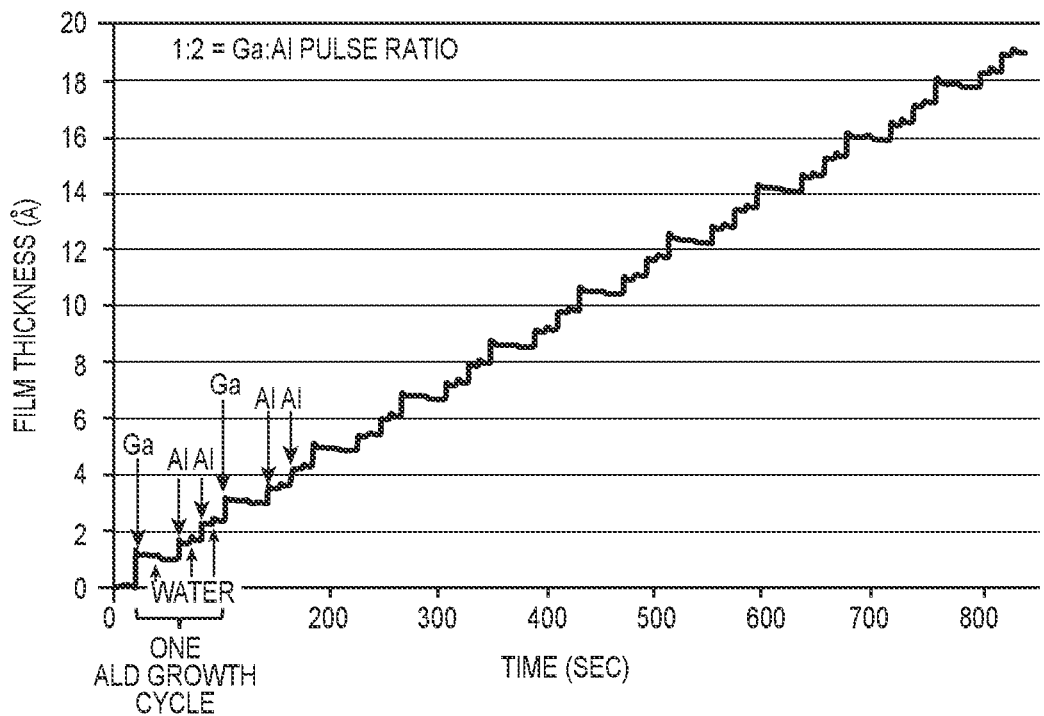

FIGS. 7A and 7B provide experimental results of the ternary gallium oxide film growth in the thermal ALD process illustrated in FIG. 5.

It will be understood that for clear illustrations, FIGS. 1-7B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure describes a thermal atomic layer deposition (ALD) process of depositing a ternary gallium oxide thin film (i.e., a doped gallium oxide thin film), which includes gallium, another metal element, and oxygen. The thermal ALD process is a subset of CVD and has been known for its excellent film thickness controllability as well as resulting pin-hole free films of high density.

The thermal ALD process is driven by surface reactivities of volatile/vapor precursors, which are applied as a series of sequential, non-overlapping pulses to form one atomic layer at a time. For each of these pulses, one volatile/vapor precursor reacts with reactive species on a current surface in a self-limiting way, and once all the reactive species on the current surface are consumed, the reaction is terminated and new surface species are yielded. By utilizing different volatile/vapor precursors and/or by applying different pulses of the volatile/vapor precursors, the film thickness can be controlled in the thermal ALD process. For instance, the more times the volatile/vapor precursors are pulsed in the thermal ALD process, the thicker the film may be formed.

FIG. 1 shows an exemplary ALD cycle in a typical ALD process. Herein, the ALD cycle starts with a surface with hydroxyls (only three hydroxyls are shown for simplicity) as the reactive species. A pulse of a vaporized metal precursor $ML_3$ (e.g., Trimethylaluminium, M is aluminum and L is a methyl ligand) is firstly applied to the surface. The vapor metal precursor $ML_3$ reacts with the surface (first reaction), such that a proton (e.g. hydrogen proton, H) is transferred to the ligand and a O—M bond is formed. The resulting protonated ligand (e.g., HL) should be volatile and unreactive, which will allow it to be purged from the system. Notice that once each hydrogen proton of the surface hydroxyls is replaced (i.e., each reactive species is consumed), the reaction of the vapor metal precursor with the surface will be terminated.

Next, water is introduced as a reactant and reacts with the M-L from the vapor metal precursor (second reaction). As such, each ligand (-L) is replaced by one hydroxyl (—OH) in water, and hydrogen protons of water and the ligands are combined to generate more by-product HL. Notice that once each ligand (-L) is replaced, the reaction between water and the M-L from the vapor metal precursor will be terminated. Herein, O-M-O becomes part of the growing film and M-OH presents a new hydroxyl coated surface that is ready for the ALD cycle to start all over again.

It is clear that the metal precursor(s) is a key factor in the ALD process. The volatility, thermal stability, and reactivity of a metal precursor used in the ALD process will significantly affect the quality and thickness of the final film. Typically, the metal precursor(s) used in the thermal ALD process must avoid condensing on the surface (i.e., volatile) in a certain temperature/pressure window, must avoid thermal decomposition (i.e., thermal stable) in the certain temperature/pressure window, and must react at the surface and with the reactant (i.e., sufficient reactivity) in the certain temperature/pressure window. If the metal precursor cannot be vaporized or the metal precursor cannot react at the surface or react with the reactant within the certain temperature/pressure window, it is not appropriate for the ALD process to operate in such a temperature/pressure window. In addition, it is necessary to have appropriate metal precursor(s) that can perform clean reactions (i.e., without side-reactions or impurity incorporation) in the certain temperature/pressure window.

In one or more embodiments of the present disclosure, the thermal ALD process of ternary gallium oxide film is achieved by utilizing a first metal (i.e., gallium) precursor, a second metal (other than gallium, e.g. aluminum) precursor, and water ($H_2O$) Hydrogen peroxide ($H_2O_2$) at a relatively low temperature, no higher than 400° C. Herein, the first/second metal precursor refers to a first/second molecule that includes the first/second metal element and one or more types of ligands surrounding the first/second metal element. The first/second metal precursor is eligible to vaporize and is thermal stable within a specific temperature window. In addition, the first/second metal precursor should undergo self-limiting surface reactivity that produces volatile by-products, where the by-products will not etch the formed film. In the disclosed thermal ALD process of the ternary gallium oxide film, water or Hydrogen peroxide is an oxygen source rather than a more reactive reagent, such as ozone or plasmas.

In one embodiment, the first metal precursor is a homoleptic gallium compound or a heteroleptic gallium compound with a formula $GaL1(L2)_2$. Herein, Ga is a central gallium atom, and L1 and L2 are ligands surrounding the central gallium atom. L1 and L2 each may be an alkyl ligand, an amido ligand, an amidinato ligand, an alkenyl ligand, or a guanidinato ligand. In different cases, L1 and L2 may be a same or different ligand, and may be chosen from a N,N'-diisopropylacetamidinato-group (-amd), a N,N'-diisopropylformamidinato-group (-famd), a methyl group (-Me), a N-butyl group (-nBu), a vinyl group (-vinyl), a dimethylamido-group (-$NMe_2$), and a N,N'-diisopropyl-N-dimethyl-guanidinato-group (-guan). For instance, the first metal precursor may be $Ga(amd)_3$, $Ga(amd)_2(Me)$, $Ga(amd)(Me)_2$, $Ga(amd)(nBu)_2$, $Ga(amd)(vinyl)_2$, $Ga(amd)(NMe_2)_2$, $Ga(guan)(NMe_2)_2$, $[Ga(famd)_3]_2$ or $[Ga(NMe_2)_3]_2$ as illustrated in FIGS. 2A and 2B.

FIG. 3 shows a thermogravimetric analysis curve of some of these gallium precursors at atmospheric pressure: $Ga(amd)_3$, $Ga(amd)_2(Me)$, $Ga(amd)(Me)_2$, and $Ga(amd)(nBu)_2$. $Ga(amd)(Me)_2$ starts to evaporate at about 90° C. and substantially fully evaporates at about 140° C., $Ga(amd)_2(Me)$ starts to evaporate at about 90° C. and substantially fully evaporates at about 275° C., $Ga(amd)(nBu)_2$ starts to evaporate at about 135° C. and substantially fully evaporates at about 225° C., and $Ga(amd)_3$ starts to evaporate at about 160° C. and substantially fully evaporates at about 325° C. It is illustrated herein that each of $Ga(amd)_3$, $Ga(amd)_2(Me)$, $Ga(amd)(Me)_2$, and $Ga(amd)(nBu)_2$ is volatile at a certain temperature range. In addition, each evaporating curve of $Ga(amd)_3$, $Ga(amd)_2(Me)$, $Ga(amd)(Me)_2$, and $Ga(amd)$ (nBu)$_2$ is relatively smooth. Therefore, Ga(amd)$_3$, Ga(amd)$_2$(Me), Ga(amd)(Me)$_2$, and Ga(amd)(nBu)$_2$ are thermally stable without decomposition in certain temperature windows.

For different applications, the thermal ALD process may operate at different temperature windows. Based on a temperature window of the thermal ALD process, the first metal precursor could be carefully selected. In one embodiment, the evaporating starting temperature of the first metal precursor may be below or within the temperature window of the thermal ALD process, while the fully evaporating temperature of the first metal precursor may be above the temperature window of the thermal ALD process. Herein, the first metal precursor demonstrates volatility and thermal stability over a range of temperatures, which satisfies requirements for the thermal ALD processing.

FIG. 4A illustrates a quartz crystal microbalance (QCM) observation of binary gallium oxide film growth in a thermal ALD process by using Ga(amd)$_3$ as a metal precursor and water as an oxygen source. FIG. 4B illustrates a vapor delivery pressure chart for both Ga(amd)$_3$ pulses and water pulses. The QCM in FIG. 4A shows stepwise growth of the binary gallium oxide film, but the growth steps decrease for each ALD cycle. In addition, the vapor delivery pressure chart in FIG. 4B shows decreasing vapor delivery pressure of Ga(amd)$_3$ pulses for ALD cycles. In other words, Ga(amd)$_3$ is less vaporized for one pulse in each ALD cycle. It is proven that the metal precursor Ga(amd)$_3$ can be nucleated onto hydroxyl surfaces. However, the metal precursor Ga(amd)$_3$ does not show sustained bulk growth of binary gallium oxide film with water. Herein, the binary gallium oxide film may stop growing at about 0.5 Å.

The second metal precursor is therefore introduced to boost precursor delivery and sustain bulk growth of the oxide film. In one embodiment, since the gallium precursor itself tends to nucleate with the aluminum oxide surfaces, the second metal precursor may be an aluminum precursor. For instance, the second metal precursor may be Trimethylaluminium (TMA), and the grown oxide film is a ternary metal oxide film gallium aluminum oxide (Ga$_x$Al1-x)$_2$O$_3$ (0<x<1).

FIG. 5 shows an exemplary flow chart of a thermal ALD process for ternary gallium oxide film growth by using the first metal precursor (i.e., gallium precursor), a second metal precursor (e.g., TMA), and water. Although steps of the flow chart are illustrated in a series, these steps are not necessarily order dependent. Some steps may be done in a different order than that presented.

Further, processes within the scope of this disclosure may include fewer or more steps than those illustrated in the flow chart.

Initially, a surface (e.g, a silicon substrate surface) with reactive hydroxyls are provided (Step 402) in a process chamber and under a certain temperature and pressure. A pulse of the gallium precursor is then delivered (Step 404) into the process chamber, and the vaporized gallium precursor reacts with the hydroxyls on the surface so as to form a first chemically bound monolayer on the surface. A pulse of water is followed (Step 406), and the vaporized water reacts with the first monolayer material. As such, a new first hydroxyl (i.e., gallium-hydroxyl, Ga—OH) coated surface is ready for further deposition. A temperature and pressure for the pulse of the gallium precursor and a temperature and pressure for the pulse of water may need to be carefully selected to ensure that the gallium precursor can remain thermally stable and the occurring reactions have no/negligible side-reactions and no/negligible impurity incorporation.

One pulse of the gallium precursor and one followed pulse of water form a first ALD sub-cycle. In some applications, the first ALD sub-cycle may also include one purge step between the pulse of the gallium precursor and the pulse of water, and another purge step after the pulse of water to remove the remaining gallium precursor, water, and/or by-product(s) after reactions. The duration of each purge step may be long enough to fully remove the remaining gallium precursor, water, and/or by-product(s) so as to avoid side-reactions.

Next, a pulse of the second metal precursor (e.g., TMA) is delivered into the process chamber (Step 408), and the vaporized second metal precursor reacts with the new first hydroxyls (i.e., Ga—OH) formed from the first ALD sub-cycle. Herein, a second chemically bound monolayer is formed due to the second metal precursor. A pulse of water is followed (Step 410), and the vaporized water reacts with the second monolayer material. As such, a new second hydroxyl coated (e.g., aluminum-hydroxyl, Al—OH) surface is ready for further deposition. A temperature and pressure for the pulse of the second metal precursor and a temperature and pressure for the pulse of water need to be carefully selected to ensure that the second metal precursor can remain thermally stable and the occurring reactions have no/negligible side-reactions and no/negligible impurity incorporation.

One pulse of the second metal precursor and one followed pulse of water form a second ALD sub-cycle. In some applications, the second ALD sub-cycle may also include one purge step between the pulse of the second metal precursor and the pulse of water, and another purge step after the pulse of water to remove the remaining second metal precursor, water, and/or by-product(s) after reactions. The duration of each purge step should be long enough to fully remove the remaining second metal precursor, water, and/or by-product(s) so as to avoid side-reactions.

The pulse of the gallium precursor in the first ALD sub-cycle and the pulse of the second metal precursor in the second ALD sub-cycle may have a same or different pulsing duration (i.e., time required to deliver the vaporized precursor). In addition, the temperature, pressure, and/or other conditions in the first ALD sub-cycle may be different or partially different from those in the second ALD sub-cycle.

In one embodiment, one first ALD sub-cycle and one followed second ALD sub-cycle may form one ALD growth cycle, where such ALD growth cycle may be repeated a number of different times based on thickness requirements in different applications. If the second metal precursor is TMA, the gallium precursor will react with the Al-OH surface in the repeated first ALD sub-cycle (except the initial first ALD sub-cycle).

In one embodiment, one first ALD sub-cycle is followed by two second ALD sub-cycles in series to form one ALD growth cycle, where such ALD growth cycle may be repeated a number of different times based on thickness requirements in different applications. If the second metal precursor is TMA, the gallium precursor will still react with the Al—OH surface in the repeated first ALD sub-cycle (except the initial first ALD sub-cycle). Notice that, the concentration ratio of gallium versus aluminum in the resulting thin film from the thermal ALD process is dependent on the pulse ratio of the gallium precursor and the TMA precursor in one ALD growth cycle.

In one embodiment, the second ALD sub-cycle (instead of the first ALD sub-cycle) is applied at the beginning of the thermal ALD process and followed by the first ALD sub-cycle to form one ALD growth cycle, where such ALD growth cycle may be repeated a number of different times based on thickness requirements in different applications. If the second metal precursor is TMA, the gallium precursor will always react with the Al—OH surface (including the initial first ALD sub-cycle).

In general, one ALD growth cycle may include one or more first ALD sub-cycles and one or more second ALD sub-cycles. The one or more first ALD sub-cycles and one or more second ALD sub-cycles may be applied sequentially in various possible orders. A concentration ratio of gallium versus the second metal element (e.g., aluminum) in the resulting ternary gallium oxide thin film can be controlled depending on ALD processing conditions, such as a sub-cycle ratio (i.e., the pulse ratio between the first metal precursor and the second metal precursor) in one ALD growth cycle, sub-cycle order in one ALD growth cycle, pulsing time of first/second metal precursor, and etc. Notice that various pulse ratios of the first metal precursor and the second metal precursor can be applied within one ALD growth cycle to achieve different concentration ratios of gallium versus the second metal element in the resulting ternary gallium oxide thin film (e.g., not limited by 1:1 or 1:2 as described above). In other words, in one ALD growth cycle, a number of the pulses of the first metal precursor is N and a number of the pulses of the second metal precursor is M, where N and M may be any positive integers.

FIG. 6 provides an exemplary ternary gallium oxide thin film formed over a substrate by the thermal ALD process illustrated in FIG. 5. The thickness of the ternary gallium oxide thin film is dependent on the number of ALD growth cycles conducted. The substrate may be formed of silicon.

FIGS. 7A and 7B illustrate experimental QCM observations for ternary gallium oxide film growth on a silicon substrate. The ternary gallium oxide film grows by the ALD process by using Ga(amd)$_3$ as the first metal precursor, TMA as the second metal precursor, and water as an oxygen source. FIG. 7A shows a film growth of the ternary gallium aluminum oxide film with a 1:1 Ga(amd)$_3$:TMA pulse ratio, where the ternary gallium aluminum oxide film grows about 10 Å thickness in about 600 seconds. FIG. 7B shows another film growth of the ternary gallium aluminum oxide film with a 1:2 Ga(amd)$_3$:TMA pulse ratio, where the ternary gallium aluminum oxide film grows about 20 Å thickness in about 800 seconds. The metal precursor Ga(amd)$_3$ and the TMA precursor show sustained bulk growth of ternary gallium oxide film with water.

Herein, the pulse ratio of Ga(amd)$_3$:TMA is only illustrated as 1:1 and 1:2. However, other pulse ratios of Ga(amd)$_3$:TMA can be applied within one ALD growth cycle to achieve different concentration ratio of gallium versus aluminum in the resulting ternary gallium oxide thin film. In general, there is no limit for the pulse ratio of the first metal precursor and the second metal precursor applied in one ALD growth cycle. With different pulse ratio of the first metal precursor and the second metal precursor, the concentration ratio of gallium versus the second metal element in the resulting ternary gallium oxide thin film, a final thickness of the resulting ternary gallium oxide thin film, and/or the duration to form the resulting ternary gallium oxide thin film may be different.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A method of a thermal atomic layer deposition (ALD) process of depositing a gallium aluminum oxide thin film, which is $(Ga_xAl_{1-x})_2O_3$, $0<x<1$, the method comprising:
   providing a reactive surface coated with hydroxyls;
   conducting one or more ALD growth cycles, wherein each of the one or more ALD growth cycles comprises one or more first ALD sub-cycles and one or more second ALD sub-cycles, wherein:
   conducting each of the one or more first ALD sub-cycles comprises:
      applying a pulse of a first metal precursor to react with the hydroxyls on the reactive surface to form a first monolayer material, wherein the first metal precursor is a gallium compound comprising one or more ligands of a N,N'-diisopropylacetamidinato-group (-amd), a N,N'-diisopropylformamidinato-group (-famd), a N-butyl group (-nBu), a vinyl group (-vinyl), and a guanidinato ligand; and
      applying a pulse of an oxygen source after applying the pulse of the first metal precursor to react with the first monolayer material to re-provide a reactive surface coated with hydroxyls; and
   conducting each of the one or more second ALD sub-cycles comprises:
      applying a pulse of a second metal precursor to react with the hydroxyls on the reactive surface to form a second monolayer material, wherein the second metal precursor is an organic aluminum precursor; and
      applying a pulse of an oxygen source after applying the pulse of the second metal precursor to react with the second monolayer material to re-provide a reactive surface coated with hydroxyls.

2. The method of claim 1 wherein:
   the oxygen source in each of the one or more first ALD sub-cycles is water; and
   the oxygen source in each of the one or more second ALD sub-cycles is water.

3. The method of claim 1 further comprising repeating the ALD growth cycle.

4. The method of claim 1 wherein conducting each of the one or more ALD growth cycles comprises conducting one first ALD sub-cycle and conducting one second ALD sub-cycle in series.

5. The method of claim 4 wherein the first ALD sub-cycle is conducted before the second ALD sub-cycle within one ALD growth cycle.

6. The method of claim 4 wherein the first ALD sub-cycle is conducted after the second ALD sub-cycle within one ALD growth cycle.

7. The method of claim 4 further comprising repeating the ALD growth cycle.

8. The method of claim 1 wherein conducting each of the one or more ALD growth cycles comprises conducting one first ALD sub-cycle and conducting two sequential second ALD sub-cycles.

9. The method of claim 8 wherein the first ALD sub-cycle is followed by the two sequential second ALD sub-cycles within one ALD growth cycle.

10. The method of claim 9 further comprising repeating the ALD growth cycle.

11. The method of claim 2, wherein conducting each of the one or more first ALD sub-cycles further comprises one purge step between applying the pulse of the first metal precursor and applying the pulse of water, and another purge step after applying the pulse of water.

12. The method of claim 2, wherein conducting each of the one or more second ALD sub-cycles further comprises one purge step between applying the pulse of the second metal precursor and applying the pulse of water, and another purge step after applying the pulse of water.

13. The method of claim 1 wherein the first metal precursor has a formula of $GaL1(L2)_2$, wherein:
Ga is a central gallium atom, and L1 and L2 are ligands surrounding the central gallium atom; and
each of L1 and L2 is selected from one of an (-amd), an (-famd), a (-nBu), a (-vinyl), and a N,N'-diisopropyl-N-dimethyl-guanidinato-group (-guan).

14. The method of claim 13 wherein L1 and L2 are a same ligand.

15. The method of claim 13 wherein L1 and L2 are different ligands.

16. The method of claim 13 wherein the first metal precursor is one of a group consisting of $Ga(amd)_3$, $[Ga(famd)_3]_2$, $Ga(amd)_2(Me)$, $Ga(amd)(Me)_2$, $Ga(amd)(nBu)_2$, $Ga(amd)(vinyl)_2$, $Ga(amd)(NMe_2)_2$, and $Ga(guan)(NMe_2)_2$.

17. The method of claim 1 wherein the first metal precursor is $Ga(amd)_3$, and the second metal precursor is Trimethylaluminium (TMA).

18. The method of claim 1 wherein a concentration ratio of gallium versus aluminum in the resulting gallium aluminum oxide thin film from the thermal ALD process is dependent on a pulse ratio between pulses of the first metal precursor and pulses of the second metal precursor within one ALD growth cycle.

19. The method of claim 18 wherein the concentration ratio of gallium versus aluminum in the resulting gallium aluminum oxide thin film is further dependent on sub-cycle order in one ALD growth cycle, pulsing time of each pulse of the first metal precursor, and pulsing time of each pulse of the second metal precursor.

20. The method of claim 1 wherein, in one ALD growth cycle, a number of the pulses of the first metal precursor is N, and a number of the pulses of the second metal precursor is M, wherein N and M are positive integers.

21. The method of claim 2 wherein, without conducting the one or more second ALD sub-cycles, the reaction between the first metal precursor and the oxygen source is incapable of forming any oxide film having a thickness greater than 5 Å.

22. The method of claim 1 wherein:
the oxygen source in each of the one or more first ALD sub-cycles is hydrogen peroxide; and
the oxygen source in each of the one or more second ALD sub-cycles is hydrogen peroxide.

* * * * *